United States Patent
Jung et al.

(10) Patent No.: US 11,955,468 B2
(45) Date of Patent: Apr. 9, 2024

(54) LIGHT EMITTING ELEMENT AND DISPLAY DEVICE INCLUDING THE SAME AND METHOD FOR MANUFACTURING DISPLAY DEVICE

(71) Applicant: Samsung Display Co., Ltd., Yongin-si (KR)

(72) Inventors: Yunku Jung, Cheonan-si (KR); Sungwoon Kim, Yongin-si (KR); Changhee Lee, Seoul (KR); Jaekook Ha, Seoul (KR); Yunhyuk Ko, Anyang-si (KR); Jaehoon Kim, Seoul (KR); Minki Nam, Incheon (KR); Hyunmi Doh, Seoul (KR); Myoungjin Park, Seoul (KR); Jae Hong Park, Seoul (KR); Junwoo Park, Hwaseong-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 16/932,591

(22) Filed: Jul. 17, 2020

(65) Prior Publication Data

US 2021/0035962 A1     Feb. 4, 2021

(30) Foreign Application Priority Data

Aug. 2, 2019 (KR) .......................... 10-2019-0094379

(51) Int. Cl.
*H01L 25/16* (2023.01)
*H01L 23/00* (2006.01)
*H01L 33/44* (2010.01)

(52) U.S. Cl.
CPC ............. *H01L 25/167* (2013.01); *H01L 24/32* (2013.01); *H01L 24/83* (2013.01); *H01L 33/44* (2013.01);
(Continued)

(58) Field of Classification Search
CPC ....... H01L 25/167; H01L 24/32; H01L 24/83; H01L 33/44; H01L 2224/32137;
(Continued)

(56) References Cited

U.S. PATENT DOCUMENTS

2013/0272965 A1   10/2013  Hyeon et al.
2016/0362602 A1   12/2016  Xin et al.
(Continued)

FOREIGN PATENT DOCUMENTS

| KR | 10-1368179 B1 | 3/2014 |
| KR | 10-1685646 B1 | 12/2016 |
| KR | 10-1886948 B1 | 8/2018 |

OTHER PUBLICATIONS

Kalsin, Alexander M., et al.; "Electrostatic Self-Assembly of Binary Nanoparticle Crystals with a Diamond-Like Lattice"; Science; vol. 312; Apr. 21, 2006; pp. 420-424.

*Primary Examiner* — Thanh T Nguyen
(74) *Attorney, Agent, or Firm* — Lewis Roca Rothgerber Christie LLP

(57) ABSTRACT

Provided is a light emitting element according to embodiments which includes a body including a semiconductor layer and an active layer, and a ligand including a head portion bonded to a surface of the body, an end portion spaced apart from the body, and having a positive or a negative charge, and a chain portion connecting the head portion and the end portion.

11 Claims, 13 Drawing Sheets

(52) U.S. Cl.
CPC ............... *H01L 2224/32137* (2013.01); *H01L 2224/80143* (2013.01); *H01L 2224/83085* (2013.01); *H01L 2224/83896* (2013.01); *H01L 2924/12041* (2013.01)

(58) Field of Classification Search
CPC . H01L 2224/80143; H01L 2224/83085; H01L 2224/83896; H01L 2924/12041; H01L 24/95; H01L 2224/95145; H01L 27/156; H01L 2224/95085; H01L 2224/95102; H01L 2933/0025; H01L 2933/0066; H01L 27/1214; H01L 33/26; H01L 33/36
See application file for complete search history.

(56) References Cited

U.S. PATENT DOCUMENTS

| | | | |
|---|---|---|---|
| 2017/0244050 A1* | 8/2017 | Lee | H01L 51/005 |
| 2018/0175009 A1* | 6/2018 | Kim | H01L 27/156 |
| 2019/0081263 A1* | 3/2019 | Park | H01L 21/02601 |
| 2020/0103755 A1* | 4/2020 | Farrell | G03F 7/16 |

* cited by examiner

LIGHT EMITTING ELEMENT AND DISPLAY DEVICE INCLUDING THE SAME AND METHOD FOR MANUFACTURING DISPLAY DEVICE

CROSS-REFERENCE TO RELATED APPLICATION

This application claims priority to, and the benefit of, Korean Patent Application No. 10-2019-0094379, filed on Aug. 2, 2019, the entire contents of which are hereby incorporated by reference.

BACKGROUND

The present disclosure herein relates to a light emitting element with improved manufacturing yield and reliability, a display device including the same, and a method for manufacturing a display device.

A light emitting diode (LED), as an element using the characteristics of a compound semiconductor to convert an electrical signal into a form of light such as infrared or visible light, is used for home appliances, remote controls, electronic display boards, a variety of automation apparatuses, and the like. As shown in the use of the light emitting diode in a wide range of electronic devices from a small-sized handheld electronic device to a large-sized display device, the light emitting diode is being more widely used.

As part of research to make use of the light emitting diode, a technique for manufacturing an ultra-small light emitting diode on a micro or nano scale is being developed. A bar-type light emitting diode, for example, can be manufactured in a small size for suitable use in pixels of a self-luminescent display panel.

SUMMARY

The present disclosure provides a light emitting element with reformed surface characteristics by applying a ligand containing an electric charge to the surface of a light emitting element body.

The present disclosure also provides a display device with improved reliability and manufacturing yield, and a method for manufacturing the same including a light emitting element with reformed surface characteristics.

Embodiments of the present disclosure provide a light emitting element including a body including a semiconductor layer and an active layer, and a ligand including a head portion bonded to a surface of the body, an end portion spaced apart from the body, and having a positive or a negative charge, and a chain portion connecting the head portion and the end portion.

The semiconductor layer may include a first semiconductor layer, and a second semiconductor layer spaced apart from the first semiconductor layer with the active layer therebetween.

The body may further include a first contact electrode adjacent to the first semiconductor layer, and a second contact electrode adjacent to the second semiconductor layer.

The body may further include an insulating film covering a side surface of the semiconductor layer and the active layer, and including a metal oxide.

The ligand may be bonded to the insulating film.

The ligand may include a first ligand including a first end portion having a positive charge, and a second ligand including a second end portion having a negative charge.

The body may include a first side surface to which the first ligand is bonded, and a second side surface facing the first side surface, and to which the second ligand is bonded.

The head portion may include at least one among a hydroxyl group, a thiol group, a catechol group, or a carboxyl group.

The chain portion may include a substituted or an unsubstituted alkyl group, a substituted or an unsubstituted amine group, a substituted or an unsubstituted oxy group, a substituted or an unsubstituted thiol group, a substituted or an unsubstituted ester group, or a substituted or an unsubstituted amide group.

A length of the body may be in a range from about 1 µm to about 100 µm.

In other embodiments of the present disclosure, a display device includes a pixel circuit, an insulating layer covering the pixel circuit, a first electrode on the insulating layer, and electrically connected to the pixel circuit, a second electrode on the insulating layer, and spaced apart from the first electrode, and a plurality of light emitting elements electrically connected to the first electrode and the second electrode, the plurality of light emitting elements including a body, and a ligand including a head portion bonded to a surface of the body, an end portion spaced apart from the body, and having a positive or a negative charge, and a chain portion connecting the head portion and the end portion.

The body may include a first contact electrode electrically connected to the first electrode, a first semiconductor layer on the first contact electrode, an active layer on the first semiconductor layer, a second semiconductor layer spaced apart from the first semiconductor layer with the active layer therebetween, and a second contact electrode on the second semiconductor layer, and electrically connected to the second electrode.

Each of the plurality of light emitting elements may further include an insulating film covering a side surface of the first semiconductor layer, of the active layer, and of the second semiconductor layer, and containing a metal oxide.

The light emitting elements may include a first light emitting element including a first ligand having a positive charge, and a second light emitting element adjacent to the first light emitting element and including a second ligand having a negative charge.

The first ligand may include a first end portion having a positive charge, the second ligand may include a second end portion having a negative charge, and the first end portion and the second end portion may be electrostatically bonded to each other.

In still other embodiments of the present disclosure, a method for manufacturing a display device includes forming a circuit layer on a base layer, forming a first electrode and a second electrode on the circuit layer, providing a plurality of light emitting elements and a solution containing a solvent on the first electrode and the second electrode, and vaporizing the solvent, wherein each of the plurality of light emitting elements includes a body, and a ligand including a head portion bonded to a surface of the body, an end portion spaced apart from the body, and having a positive or a negative charge, and a chain portion connecting the head portion and the end portion.

The light emitting elements may include a first light emitting element including a first ligand having a positive charge, and a second light emitting element adjacent to the first light emitting element, and including a second ligand having a negative charge that is electrostatically bonded to the first ligand.

During vaporizing the solvent, the plurality of light emitting elements may be aligned by electrostatically bonding the first ligand and the second ligand in the solution.

The solvent may be water soluble.

The chain portion may be a substituted or an unsubstituted alkyl group, a substituted or an unsubstituted amine group, a substituted or an unsubstituted oxy group, a substituted or an unsubstituted thiol group, a substituted or an unsubstituted ester group, or a substituted or an unsubstituted amide group.

BRIEF DESCRIPTION OF THE DRAWINGS

The accompanying drawings are included to provide a further understanding of the present disclosure, and are incorporated in, and constitute a part of, this specification. The drawings illustrate embodiments of the present disclosure and, together with the description, serve to explain aspects of the present disclosure. In the drawings.

DETAILED DESCRIPTION

Figure 1:
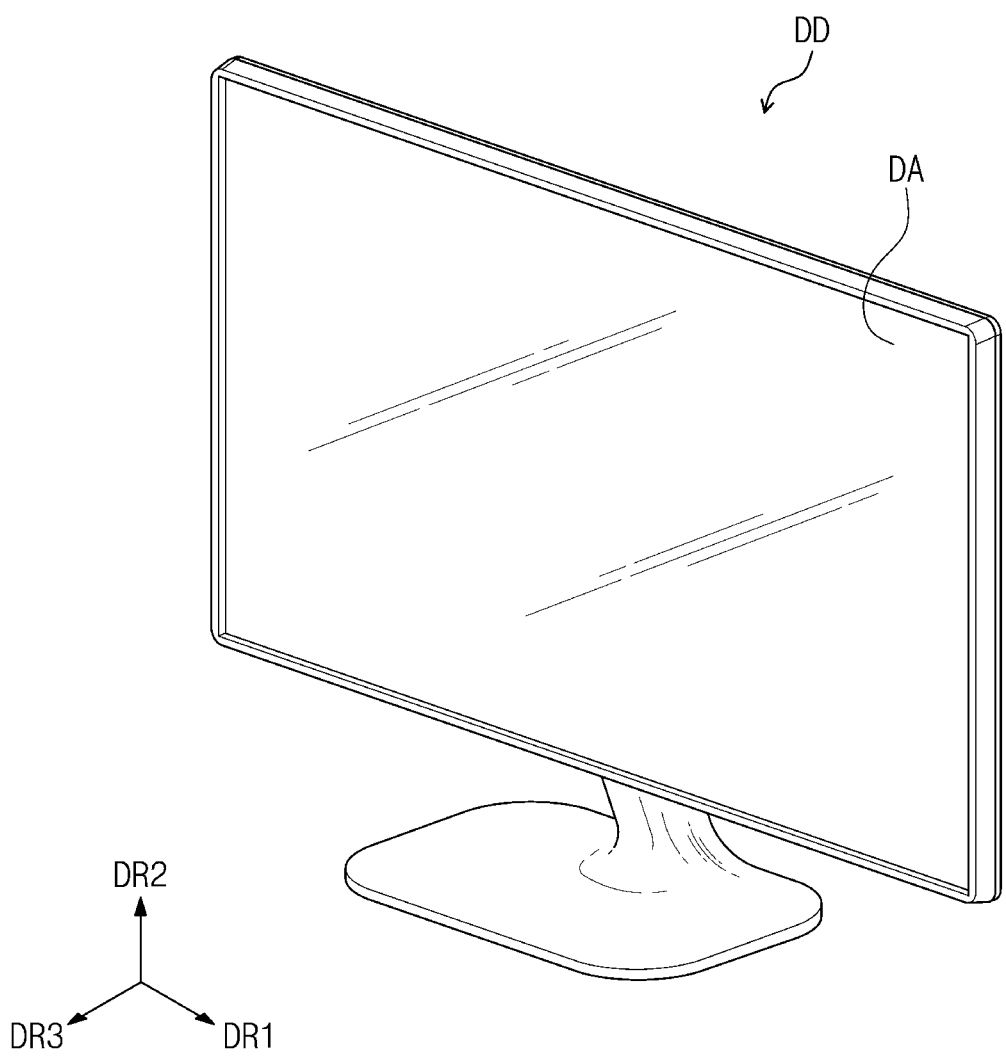
FIG. 1 is a perspective view of a display device according to an embodiment of the present disclosure.

Features of the inventive concept and methods of accomplishing the same may be understood more readily by reference to the detailed description of embodiments and the accompanying drawings. Hereinafter, embodiments will be described in more detail with reference to the accompanying drawings. The described embodiments, however, may be embodied in various different forms, and should not be construed as being limited to only the illustrated embodiments herein. Rather, these embodiments are provided as examples so that this disclosure will be thorough and complete, and will fully convey the aspects and features of the present inventive concept to those skilled in the art. Accordingly, processes, elements, and techniques that are not necessary to those having ordinary skill in the art for a complete understanding of the aspects and features of the present inventive concept may not be described.

Unless otherwise noted, like reference numerals denote like elements throughout the attached drawings and the written description, and thus, descriptions thereof will not be repeated. Further, parts not related to the description of the embodiments might not be shown to make the description clear. In the drawings, the relative sizes of elements, layers, and regions may be exaggerated for clarity.

Various embodiments are described herein with reference to sectional illustrations that are schematic illustrations of embodiments and/or intermediate structures. As such, variations from the shapes of the illustrations as a result, for example, of manufacturing techniques and/or tolerances, are to be expected. Further, specific structural or functional descriptions disclosed herein are merely illustrative for the purpose of describing embodiments according to the concept of the present disclosure. Thus, embodiments disclosed herein should not be construed as limited to the particular illustrated shapes of regions, but are to include deviations in shapes that result from, for instance, manufacturing.

For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the drawings are schematic in nature and their shapes are not intended to illustrate the actual shape of a region of a device and are not intended to be limiting. Additionally, as those skilled in the art would realize, the described embodiments may be modified in various different ways, all without departing from the spirit or scope of the present disclosure.

In the detailed description, for the purposes of explanation, numerous specific details are set forth to provide a thorough understanding of various embodiments. It is apparent, however, that various embodiments may be practiced without these specific details or with one or more equivalent arrangements. In other instances, well-known structures and devices are shown in block diagram form in order to avoid unnecessarily obscuring various embodiments.

It will be understood that, although the terms "first," "second," "third," etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present disclosure.

Spatially relative terms, such as "beneath," "below," "lower," "under," "above," "upper," and the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly. Similarly, when a first part is described as being arranged "on" a second part, this indicates that the first part is arranged at an upper side or a lower side of the second part without the limitation to the upper side thereof on the basis of the gravity direction.

Further, in this specification, the phrase "on a plane," or "plan view," means viewing a target portion from the top, and the phrase "on a cross-section" means viewing a cross-section formed by vertically cutting a target portion from the side.

It will be understood that when an element, layer, region, or component is referred to as being "on," "connected to," or "coupled to" another element, layer, region, or component, it can be directly on, connected to, or coupled to the other element, layer, region, or component, or one or more intervening elements, layers, regions, or components may be present. However, "directly connected/directly coupled" refers to one component directly connecting or coupling another component without an intermediate component. Meanwhile, other expressions describing relationships between components such as "between," "immediately between" or "adjacent to" and "directly adjacent to" may be construed similarly. In addition, it will also be understood that when an element or layer is referred to as being "between" two elements or layers, it can be the only element or layer between the two elements or layers, or one or more intervening elements or layers may be present.

For the purposes of this disclosure, expressions such as "at least one of," or "one or more of" when preceding a list of elements, modify the entire list of elements and do not modify the individual elements of the list. For example, "at least one of X, Y, and Z" and "at least one among X, Y, and Z" may be construed as X only, Y only, Z only, or any combination of two or more of X, Y, and Z, such as, for instance, XYZ, XYY, YZ, and ZZ. Like numbers refer to like elements throughout. As used herein, the term "and/or" includes any and all combinations of one or more of the associated listed items.

The terminology used herein is for the purpose of describing particular embodiments only and is not intended to be limiting of the present disclosure. As used herein, the singular forms "a" and "an" are intended to include the plural forms as well, unless the context clearly indicates otherwise. It will be further understood that the terms "comprises," "comprising," "have," "having," "includes," and "including," when used in this specification, specify the presence of the stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items.

As used herein, the term "substantially," "about," "approximately," and similar terms are used as terms of approximation and not as terms of degree, and are intended to account for the inherent deviations in measured or calculated values that would be recognized by those of ordinary skill in the art. "About" or "approximately," as used herein, is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value. Further, the use of "may" when describing embodiments of the present disclosure refers to "one or more embodiments of the present disclosure."

When a certain embodiment may be implemented differently, a specific process order may be performed differently from the described order. For example, two consecutively described processes may be performed substantially at the same time or performed in an order opposite to the described order.

Also, any numerical range disclosed and/or recited herein is intended to include all sub-ranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein, and any minimum numerical limitation recited in this specification is intended to include all higher numerical limitations subsumed therein. Accordingly, Applicant reserves the right to amend this specification, including the claims, to expressly recite any sub-range subsumed within the ranges expressly recited herein. All such ranges are intended to be inherently described in this specification such that amending to expressly recite any such subranges would comply with the requirements of 35 U.S.C. § 112(a) and 35 U.S.C. § 132(a).

The electronic or electric devices and/or any other relevant devices or components according to embodiments of the present disclosure described herein may be implemented utilizing any suitable hardware, firmware (e.g. an application-specific integrated circuit), software, or a combination of software, firmware, and hardware. For example, the various components of these devices may be formed on one integrated circuit (IC) chip or on separate IC chips. Further, the various components of these devices may be implemented on a flexible printed circuit film, a tape carrier package (TCP), a printed circuit board (PCB), or formed on one substrate.

Further, the various components of these devices may be a process or thread, running on one or more processors, in one or more computing devices, executing computer program instructions and interacting with other system components for performing the various functionalities described herein. The computer program instructions are stored in a memory which may be implemented in a computing device using a standard memory device, such as, for example, a random access memory (RAM). The computer program instructions may also be stored in other non-transitory computer readable media such as, for example, a CD-ROM, flash drive, or the like. Also, a person of skill in the art should recognize that the functionality of various computing devices may be combined or integrated into a single computing device, or the functionality of a particular computing device may be distributed across one or more other computing devices without departing from the spirit and scope of the embodiments of the present disclosure.

Unless otherwise defined, all terms (including technical and scientific terms) used herein have the same meaning as commonly understood by one of ordinary skill in the art to which the present inventive concept belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

FIG. 1 is a perspective view of a display device according to an embodiment of the present disclosure.

Referring to FIG. 1, a display device DD may display an image through a display area DA. FIG. 1 shows that the display area DA is provided on a surface defined by a first direction DR1 and a second direction DR2 crossing the first direction DR1. In another embodiment of the present disclosure, however, the display area of the display device may be provided on a curved surface.

A thickness direction of the display device DD may be indicated by a third direction DR3. The directions that the first to third directions DR1, DR2, and DR3 indicate are relative concepts, and may be converted to other directions. As used herein, the term "when viewed on a plane" may refer to a case viewed from the third direction DR3. Also, the "thickness direction" may indicate the third direction DR3.

FIG. 1 shows that the display device DD is a television. However, the display device DD may also be used not only for a large electronic device, such as a monitor or an outdoor billboard, but also for small and medium-sized electronic devices, such as a personal computer, a notebook computer, a personal digital terminal, a car navigation unit, a game console, a smartphone, a tablet, and a camera. In addition, these are just presented merely as examples, and of course, the display device DD may be adopted for other electronic devices without departing from the present disclosure.

Figure 2:
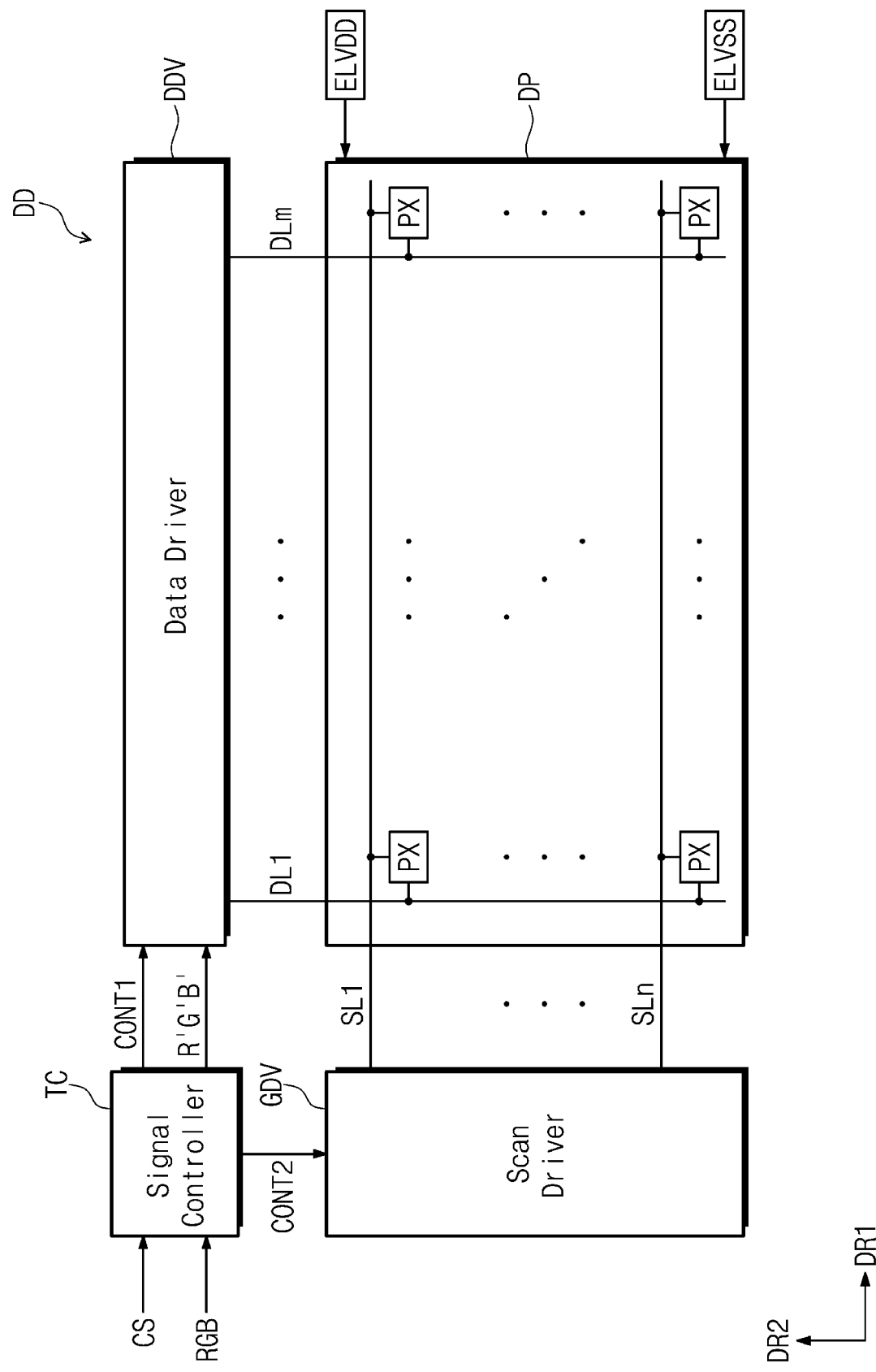
FIG. 2 is a block diagram of a display device according to an embodiment of the present disclosure.

FIG. 2 is a block diagram of a display device according to an embodiment of the present disclosure.

Referring to FIG. 2, the display device DD may include a display panel DP, a signal controller TC or a timing controller, a data driver DDV, and a scan driver GDV. Each of the signal controller TC, the data driver DDV, and the scan driver GDV may include a circuit.

The display panel DP may be an ultra-small light emitting element display panel DP including an ultra-small light emitting element. For example, the display panel DP may be a micro LED display panel DP.

The display panel DP may include a plurality of scan lines SL1-SLn, a plurality of data lines DL1-DLm, and a plurality of pixels PX.

The plurality of scan lines SL1-SLn may extend in a first direction DR1 and may be arranged along a second direction DR2 crossing the first direction DR1. The plurality of data lines DL1-DLm may extend in the second direction DR2 and may be arranged along the first direction DR1.

Each of the pixels PX may include a light emitting element and a pixel circuit electrically connected to the light emitting element. The pixel circuit may include a plurality of transistors. A first power voltage ELVDD and a second power voltage ELVSS may be provided to each of the pixels PX.

The pixels PX may be arranged on a plane of the display panel DP (e.g., according to a predetermined rule or arrangement). Each of the pixels PX may display one of primary colors or one of mixed colors. The primary colors may include red, green, and blue, and the mixed colors may include various colors such as yellow, cyan, magenta, and white. However, the color displayed by the pixels PX is not limited thereto.

The signal controller TC receives image data RGB, which may be externally provided. The signal controller TC converts the image data RGB to conform to the operation of the display panel DP to generate the converted image data R'G'B', and outputs the converted image data R'G'B' to the data driver DDV.

In addition, the signal controller TC may receive a control signal CS provided from the outside. The control signal CS may include a vertical synchronization signal, a horizontal synchronization signal, a main clock signal, and a data enable signal. The signal controller TC provides a first control signal CONT1 to the data driver DDV, and a second control signal CONT2 to the scan driver GDV. The first control signal CONT1 is a signal for controlling the data driver DDV, and the second control signal CONT2 is a signal for controlling the scan driver GDV.

The data driver DDV may provide an electrical signal to the plurality of data lines DL1-DLm in response to the first control signal CONT1 received from the signal controller TC. The data driver DDV may be implemented as an independent integrated circuit to be electrically connected to one side of the display panel DP, or to be directly mounted on the display panel DP. In addition, the data driver DDV may be implemented as a single chip or may include a plurality of chips.

The scan driver GDV may provide an electrical signal to the scan lines SL1-SLn in response to the second control signal CONT2 received from the signal controller TC. The scan driver GDV may be integrated in an area (e.g., in a predetermined area) of the display panel DP. For example, the scan driver GDV may include a plurality of thin film transistors formed through the same process as the driving circuit of the pixels PX, for example, a low temperature polycrystalline silicon (LTPS) process or a low temperature polycrystalline oxide (LTPO) process. Also, in another embodiment of the present disclosure, the scan driver GDV may be implemented as an independent integrated circuit chip to be electrically connected to one side of the display panel DP.

While a gate-on voltage is applied to one of the scan lines SL1-SLn, a switching transistor of each of the pixels PX arranged in one row connected thereto is turned on. In this case, the data driver DDV provides data driving signals to the data lines DL1-DLm. The data driving signals supplied to the data lines DL1-DLm are applied to the corresponding pixels PX through the turned-on switching transistors. The data driving signals may be analog voltages corresponding to gray-scale values of image data RGB.

Figure 3:
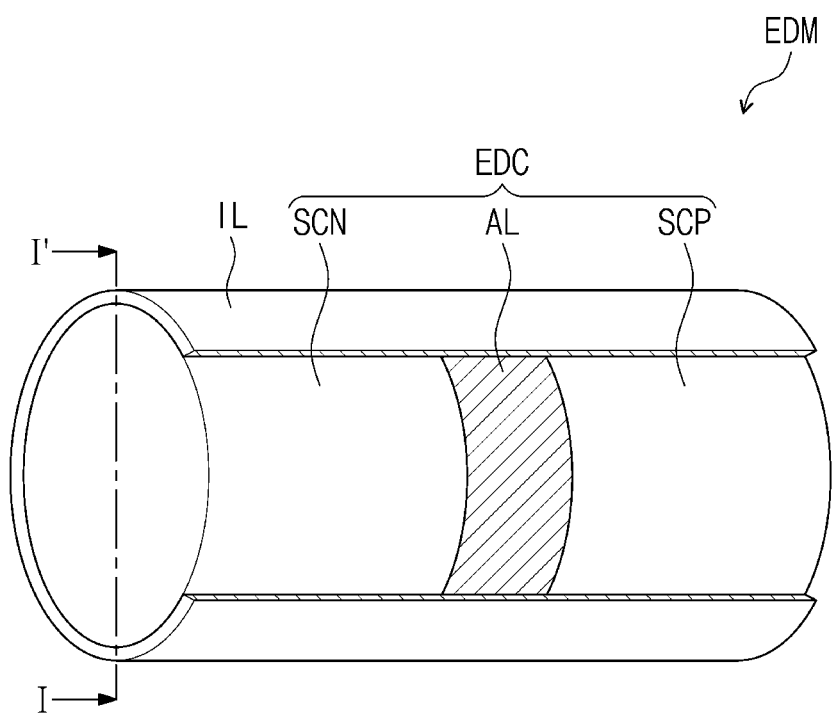
FIG. 3 is a perspective view illustrating part of a light emitting element according to an embodiment of the present disclosure.
Figure 4A:
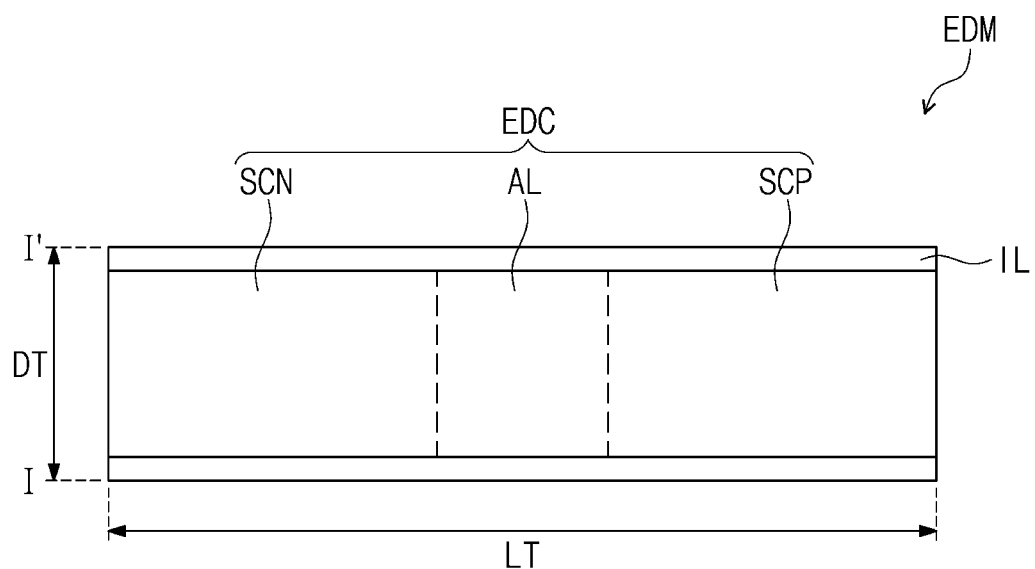
FIGS. 4A to 4C are a cross-sectional view illustrating part of a light emitting element according to an embodiment of the present disclosure.
Figure 4B:
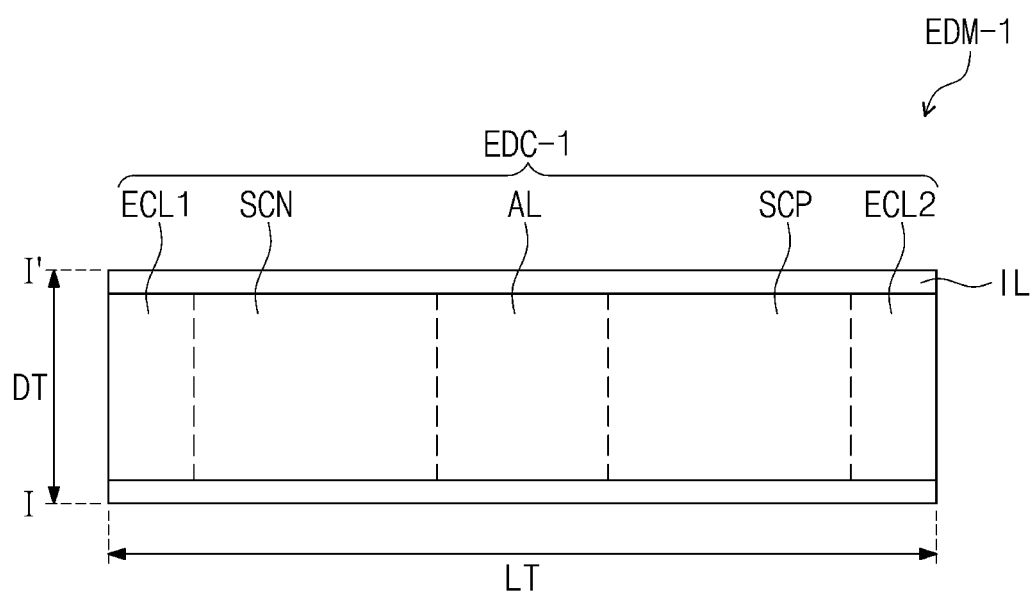
Figure 4C:
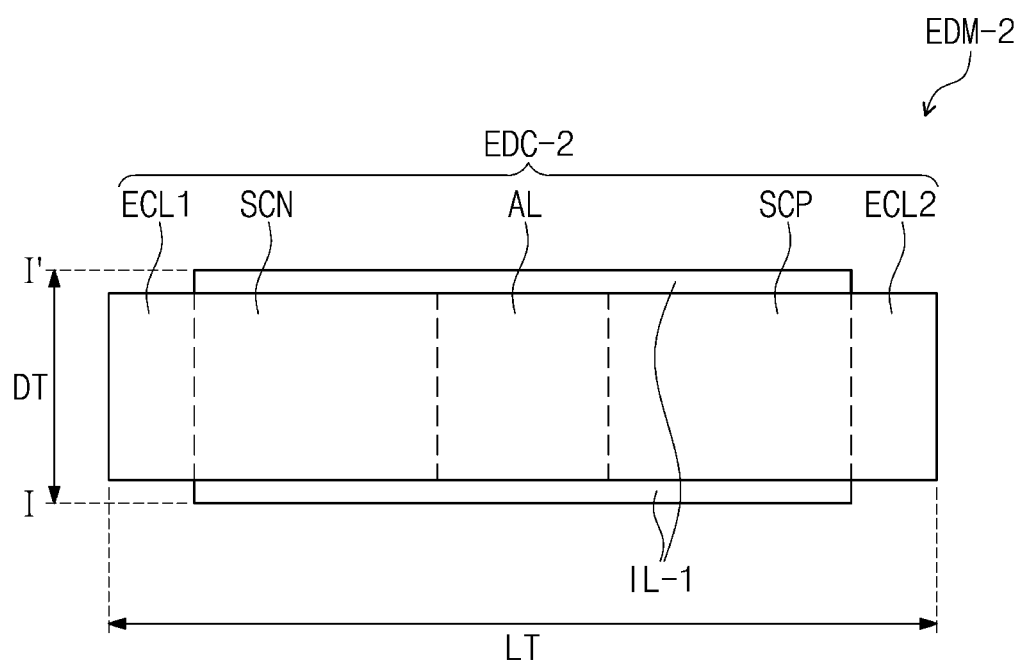

FIG. 3 is a perspective view of some components of a light emitting element according to an embodiment of the present disclosure. FIGS. 4A to 4C are cross-sectional views of some components of a light emitting element according to an embodiment of the present disclosure. FIGS. 3 and 4A to 4C illustrate the configuration of a body EDM of a light emitting element according to an embodiment. FIGS. 4A to 4C are cross-section views taken along line I-I' of FIG. 3.

The light emitting element according to an embodiment may be an ultra-small LED element. The ultra-small LED element may be an LED element having a length between about several nanometers and about several hundred micrometers. However, the length of the ultra-small LED element is described as one example only, the length of the ultra-small LED element is not limited to the above numerical range.

Referring to FIG. 3, a body EDM of the light emitting element according to an embodiment may have various shapes, such as a cylindrical shape or a polygonal column shape. Though FIG. 3 shows that the body EDM of the light emitting element is a cylindrical LED element, the present disclosure is not limited thereto, and the body EDM of the light emitting element may have various polygonal column shapes, including a rectangular parallelepiped shape. The body EDM may have a long bar shape in the longitudinal direction.

Referring to FIGS. 3 and 4A, in some embodiments the body EDM of the light emitting element according to an embodiment includes semiconductor layers SCP and SCN and an active layer AL. The body EDM may include a first semiconductor layer SCN, a second semiconductor layer SCP, and an active layer AL. The active layer AL may be located between the first semiconductor layer SCN and the second semiconductor layer SCP. The body EDM may further include an insulating film IL covering a side of a core portion EDC, the core portion EDC including the semiconductor layers SCP and SCN and the active layer AL.

The first semiconductor layer SCN may be an n-type semiconductor layer provided by being doped with an n-type dopant to the semiconductor layer. The second semiconductor layer SCP may be a p-type semiconductor layer provided by being doped with a p-type dopant to the semiconductor layer. The semiconductor layer may include a semiconductor material, and the semiconductor material may be, for example, GaN, AlN, AlGaN, InGaN, InN, InAlGaN, or AlInN, but is not limited thereto. The n-type dopant may be silicon (Si), germanium (Ge), tin (Sn), selenium (Se), tellurium (Te), or a combination thereof, but is not limited thereto. The p-type dopant may be magnesium (Mg), zinc (Zn), calcium (Ca), strontium (Sr), or barium (Ba), or a combination thereof, but is not limited thereto.

The active layer AL may be formed with at least one of a single quantum well structure, a multi quantum well structure, a quantum wire structure, or a quantum dot structure. The active layer AL may be an area where electrons injected through the first semiconductor layer SCN and holes injected through the second semiconductor layer SCP are recombined. The active layer AL is a layer that emits light having energy determined by an intrinsic energy band of a material. The position of the active layer AL may change in various ways according to the type of element.

The first semiconductor layer SCN may be connected to one of a first electrode E1 (see FIG. 6) and a second electrode E2 (see FIG. 6), and the second semiconductor layer SCP may be connected to the other one of the first electrode E1 and the second electrode E2.

The length LT of the body EDM may be between about several hundred nanometers and about several hundred micrometers. The length LT of the body EDM may be, for example, between about 1 micrometer and about 100 micrometers.

The width DT of the body EDM may be between about several nanometers and about several micrometers. The width DT of the body EDM may be, for example, between about 100 nanometers and about 1 micrometer. The ratio of the length LT to the width DT of the body EDM, that is, the aspect ratio, may be between about 5:1 and about 10:1.

The insulating film IL may cover sides of the first semiconductor layer SCN, the second semiconductor layer SCP, and the active layer AL, and may protect the outer surfaces of the first semiconductor layer SCN, the second semiconductor layer SCP, and the active layer AL. In another embodiment of the present disclosure, the insulating film IL may cover only the active layer AL. The insulating film IL may include a metal oxide. For example, the insulating film IL may include one or more insulating materials selected from the group consisting of $SiO_2$, $Si_3N_4$, $Al_2O_3$, and/or $TiO_2$, but is not limited thereto.

Referring to FIG. 4B, in some embodiments the body EDM-1 may further include a first contact electrode ECL1 and a second contact electrode ECL2 when compared to the body EDM of FIG. 4A. That is, the core portion EDC-1 may include the first semiconductor layer SCN, the active layer AL, the second semiconductor layer SCP, the first contact electrode ECL1, and the second contact electrode ECL2.

The first contact electrode ECL1 may be adjacent to the first semiconductor layer SCN, and the second contact electrode ECL2 may be adjacent to the second semiconductor layer SCP. For example, the first contact electrode ECL1, the first semiconductor layer SCN, the active layer AL, the second semiconductor layer SCP, and the second contact electrode ECL2 may be sequentially located.

Each of the first contact electrode ECL1 and the second contact electrode ECL2 may be made of a metal or an alloy of metals. For example, each of the first contact electrode ECL1 and the second contact electrode ECL2 may include any one metal or an alloy of the metals selected from molybdenum (Mo), chromium (Cr), nickel (Ni), gold (Au), aluminum (Al), titanium (Ti), platinum (Pt), vanadium (V), tungsten (W), lead (Pd), copper (Cu), rhodium (Rh) and/or iridium (Ir). The first contact electrode ECL1 and the second contact electrode ECL2 may include the same material as each other, or may include different materials from each other. Each of the first contact electrode ECL1 and the second contact electrode ECL2 may be electrically connected to a corresponding one of the first electrode E1 (see FIG. 6) and the second electrode E2 (see FIG. 6).

Referring to FIG. 4C, in other embodiments, the body EDM-2 may include an insulating film IL-1 having a different shape when compared to that of the body EDM-1 of the example shown in FIG. 4B.

The insulating film IL-1 may cover the first semiconductor layer SCN, the second semiconductor layer SCP, and the active layer AL, while not covering the first contact electrode ECL1 and the second contact electrode ECL2. However, the disclosed embodiments are not limited thereto, and in other embodiments, the insulating film IL-1 may cover at least a part of the first contact electrode ECL1 and the second contact electrode ECL2, or may cover both the first contact electrode ECL1 and the second contact electrode ECL2.

Figure 5A:
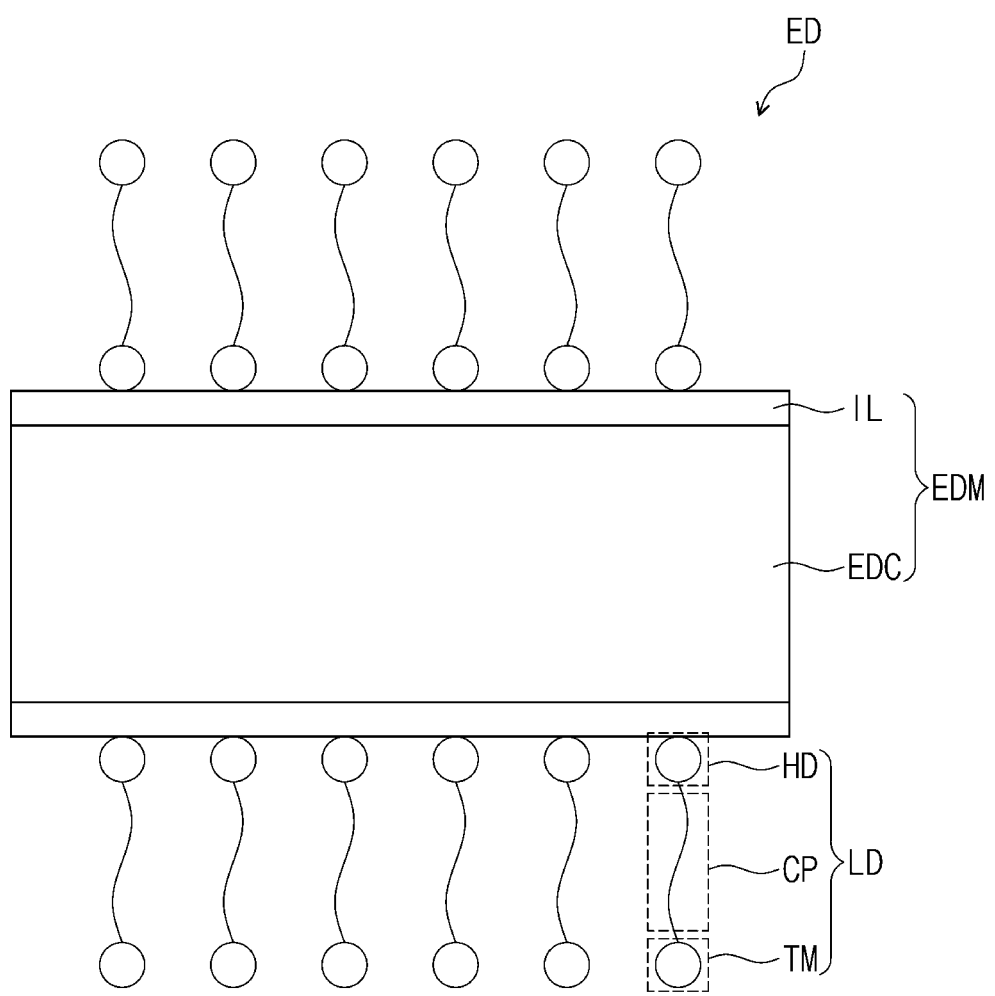
FIGS. 5A and 5B are a cross-sectional view of a light emitting element according to an embodiment of the present disclosure.
Figure 5B:
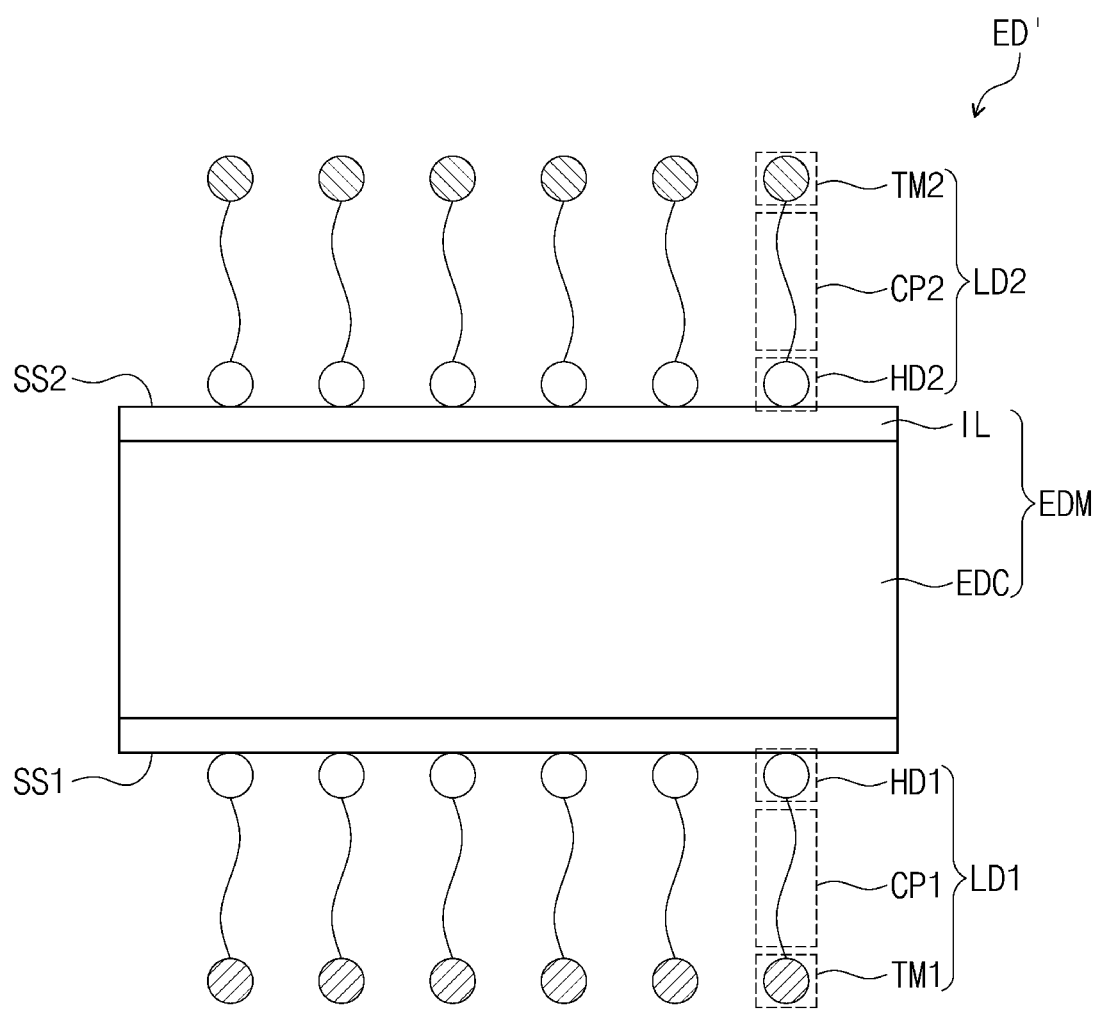

FIG. 5A is a cross-sectional view of a light emitting element according to an embodiment of the present disclosure. FIG. 5B is a cross-sectional view of a light emitting element according to another embodiment of the present disclosure.

Referring to FIG. 5A, a light emitting element ED according to an embodiment includes a body EDM, and a ligand LD bonded to a surface of the body EDM. The body EDM may include a core portion EDC, and an insulating film IL covering a side of the core portion EDC. Hereinafter, the description of the body EDM may be equally applicable to the description of the body EDM, EDM-1, and EDM-2 of the above embodiment described in FIGS. 4A to 4C.

The ligand LD may be bonded to the surface of the body EDM of the light emitting element ED and, for example, may be bonded to the surface of the insulating film IL. The ligand LD may include a head portion HD bonded to the surface of the body EDM, an end portion TM spaced apart from the body EDM and having an electric charge, and a chain portion CP connecting the head portion HD and the end portion TM.

The head portion HD may include a functional group for bonding to the surface of the body EDM (e.g., to the surface of the insulating film IL). In one embodiment, the head portion HD may include at least one among a hydroxyl group, a thiol group, a catechol group, or a carboxyl group. The head portion HD may include at least one functional group for bonding to the surface of the insulating film IL.

For example, the head portion HD may include one catechol group or carboxyl group or two hydroxyl groups.

The end portion TM may include a positive or a negative charge. The end portion TM may include a functional group having a positive charge, or a functional group having a negative charge. In one embodiment, the functional group with a positive charge may be an ammonium cation. In one embodiment, the functional group with a negative charge may be a sulfonate anion.

The chain portion CP may connect the head portion HD and the end portion TM, and may be selected to be a suitable length so that the ligand LD can be formed in a suitable length. The chain portion CP may be, for example, a substituted or unsubstituted alkyl group, a substituted or unsubstituted amine group, a substituted or unsubstituted oxy group, a substituted or unsubstituted thiol group, a substituted or unsubstituted ester group, or a substituted or unsubstituted amide group. The chain portion CP may include functional groups, such as an amine group, an oxy group, and/or an amide group such that the light emitting element ED is evenly dispersed in a solution INC (see FIG. 8A) to be described later.

Referring to FIG. 5B, a light emitting element ED' according to an embodiment may include a first ligand LD1 and a second ligand LD2, which are different from each other. The first ligand LD1 is bonded to a first side surface SS1 of the light emitting element ED', and the second ligand LD2 is bonded to a second side surface SS2 facing the first side surface SS1 of the light emitting element ED'.

The first ligand LD1 may include a first head portion HD1, a first chain portion CP1, and a first end portion TM1. The second ligand LD2 may include a second head portion HD2, a second chain portion CP2, and a second end portion TM2.

The first end portion TM1 may include a functional group having a positive charge. For example, the first end portion TM1 may include a functional group having an ammonium cation. The second end portion TM2 may include a functional group having a negative charge. For example, the second end portion TM2 may include a functional group having a sulfonate anion.

The first head portion HD1 and the first chain portion CP1 may be selected according to the characteristics of the first ligand LD1. The second head portion HD2 and the second chain portion CP2 may be selected according to the characteristics of the second ligand LD2. In an embodiment, the first head portion HD1 and the second head portion HD2 may be identical. The first chain portion CP1 and the second chain portion CP2 may be identical. That is, the first ligand LD1 and the second ligand LD2 may be the same except for having the end portion TM1 and TM2 containing different electric charges.

Figure 6:
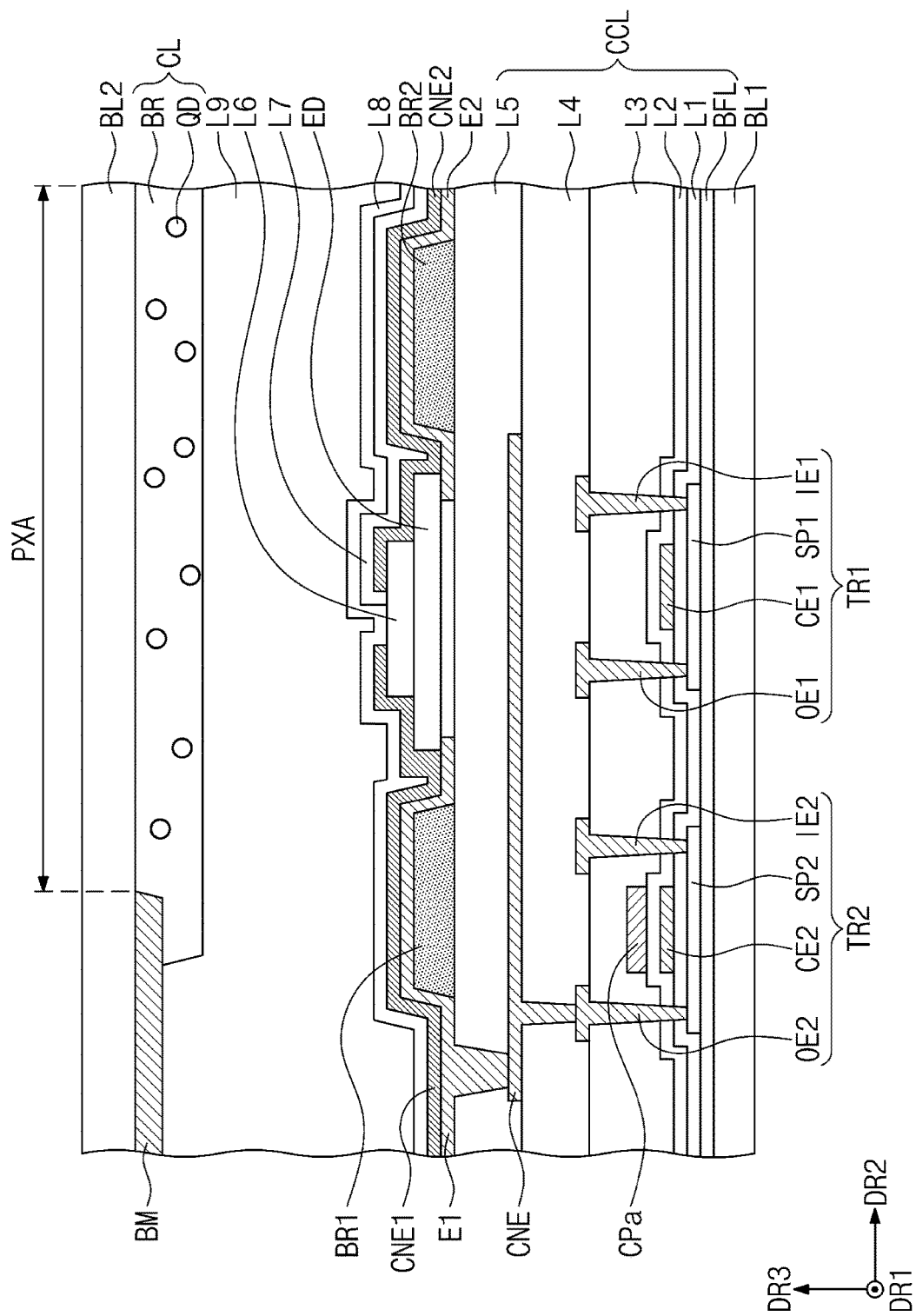
FIG. 6 is a cross-sectional view of a display panel according to an embodiment of the present disclosure.

FIG. 6 is a cross-sectional view of a display panel according to an embodiment of the present disclosure. For ease of description, areas corresponding to one pixel are illustrated in FIG. 6 while some components are excluded in the illustration.

Referring to FIG. 6, a first base layer BL1 and a second base layer BL2 may face each other. Each of the first base layer BL1 and the second base layer BL2 may be a stack structure including a silicon substrate, a plastic substrate, a glass substrate, an insulating film, and/or a plurality of insulating layers.

A circuit layer CCL may be located on the first base layer BL1. The circuit layer CCL may include a stack structure including a plurality of insulating layers, a plurality of transistors, and a plurality of electrodes. For example, the circuit layer CCL may include a buffer layer BFL, a first insulating layer L1, a first thin film transistor TR1, a second thin film transistor TR2, a second insulating layer L2, a third insulating layer L3, a fourth insulating layer L4, a connection electrode CNE, and a fifth insulating layer L5.

The buffer layer BFL may be located on the first base layer BL1. The first thin film transistor TR1 and the second thin film transistor TR2 may be located on the buffer layer BFL.

The first thin film transistor TR1 may include a first control electrode CE1, a first input electrode IE1, a first output electrode OE1, and a first semiconductor pattern SP1. The second thin film transistor TR2 may include a second control electrode CE2, a second input electrode IE2, a second output electrode OE2, and a second semiconductor pattern SP2.

The first semiconductor pattern SP1 and the second semiconductor pattern SP2 may be located on the buffer layer BFL. The buffer layer BFL may provide a reformed surface on the first semiconductor pattern SP1 and the second semiconductor pattern SP2. In this case, the first semiconductor pattern SP1 and the second semiconductor pattern SP2 may have a higher adhesive force to the buffer layer BFL than when directly formed on the first base layer BL1. Also, the buffer layer BFL may be a barrier layer for protecting lower surfaces of each of the first semiconductor pattern SP1 and the second semiconductor pattern SP2. In this case, the buffer layer BFL may reduce or prevent contamination or moisture entering into the first base layer BL1 itself or entering through the first base layer BL1 from penetrating into the first semiconductor pattern SP1 and the second semiconductor pattern SP2.

The first insulating layer L1 may be located on the buffer layer BFL and may cover the first semiconductor pattern SP1 and the second semiconductor pattern SP2. The first insulating layer L1 may include an inorganic material. The inorganic material may be, for example, but not limited to, silicon nitride, silicon oxynitride, silicon oxide, titanium oxide, and/or aluminum oxide.

The first control electrode CE1 and the second control electrode CE2 may be located on the first insulating layer L1. The second insulating layer L2 may be located on the first insulating layer L1 and may cover the first control electrode CE1 and the second control electrode CE2. The second insulating layer L2 may include an inorganic material.

A capacitor may include a first cap electrode and a second cap electrode CPa. For example, the first cap electrode may be branched from the second control electrode CE2, and the second cap electrode CPa may be located on the second insulating layer L2.

The third insulating layer L3 may be located on the second insulating layer L2, and may cover the second cap electrode CPa. The first input electrode IE1, the first output electrode OE1, the second input electrode IE2, and the second output electrode OE2 may be located on the third insulating layer L3. The first input electrode IE1 and the first output electrode OE1 may be connected to the first semiconductor pattern SP1 through through-holes penetrating through the first to third insulating layers L1, L2, and L3. The second input electrode IE2 and the second output electrode OE2 may be connected to the second semiconductor pattern SP2 through through-holes penetrating through the first to third insulating layers L1, L2, and L3. Not only the first input electrode IE1, the first output electrode OE1, the second input electrode IE2, and the second output electrode OE2, but also signal wires, for example, at least some of each of the scan lines and/or the data lines may be located on the third insulating layer L3.

The fourth insulating layer L4 may be located on the third insulating layer L3, and may cover the first input electrode IE1, the first output electrode OE1, the second input electrode IE2, and the second output electrode OE2. The fourth insulating layer L4 may be a single layer or a plurality of layers, and the fourth insulating layer L4 may include an organic material and/or an inorganic material.

The connection electrode CNE may be located on the fourth insulating layer L4. Not only the connection electrode CNE, but also signal lines, for example, at least some other of each of the scan lines and/or the data lines, may be located on the fourth insulating layer L4. The connection electrode CNE may be connected to the second output electrode OE2.

The fifth insulating layer L5 may be located on the fourth insulating layer L4 and may cover the connection electrode CNE. The fifth insulating layer L5 may include an organic material. The fifth insulating layer L5 may cover a pixel circuit to be located below and may provide a flat surface.

A first barrier portion BR1 and a second barrier portion BR2 are located on the fifth insulating layer L5. Each of the first and second barrier portions BR1 and BR2 may extend in the first direction DR1. The second barrier portion BR2 may be spaced apart from the first barrier portion BR1 in the second direction DR2. The first barrier portion BR1 and the second barrier portion BR2 may include the same material. For example, the first barrier portion BR1 and the second barrier portion BR2 may include an organic material.

The first electrode E1 may be located on the first barrier portion BR1, and the second electrode E2 may be located on the second barrier portion BR2. The first electrode E1 may extend in the first direction DR1 and may cover the first barrier portion BR1, and the second electrode E2 may extend in the first direction DR1, and may cover the second barrier portion BR2. That is, the first barrier portion BR1 may be located between the first electrode E1 and the fifth insulating layer L5, and the second barrier portion BR2 may be located between the second electrode E2 and the fifth insulating layer L5.

A through-hole may be provided in the fifth insulating layer L5, and the connection electrode CNE may be exposed by the through-hole. The first electrode E1 may be electrically connected to the connection electrode CNE to be exposed. in other embodiments, the second electrode E2 may be electrically connected to a second power line. That is, the second power voltage ELVSS (see FIG. 2) may be provided to the second electrode E2.

Each of the first electrode E1 and the second electrode E2 may have a single layer structure, or may have a plurality of layers or stack structures. For example, in some embodiments, each of the first electrode E1 and the second electrode E2 may include a reflection electrode, and a capping electrode located on the reflection electrode. The reflection electrode may have a single layer structure or may have a plurality of layers or stack structures. For example, the reflection electrode may have a structure in which indium tin oxide (ITO), silver (Ag), and indium tin oxide (ITO) are sequentially stacked. However, this is just one example and the present disclosure is not limited thereto. The capping electrode may cap the reflection electrode. The capping electrode may include at least one among indium zinc oxide (IZO), indium tin oxide (ITO), indium gallium oxide (IGO), indium gallium zinc oxide (IGZO), or a mixture/compound thereof.

The light emitting element ED may be located on the fifth insulating layer L5. The light emitting element ED may be provided in plurality, and light emitting elements ED that are provided in plurality may be connected in parallel. In some embodiments, an insulating pattern may be further located between the fifth insulating layer L5 and the light emitting element ED. The light emitting element ED may be electrically connected to the first electrode E1 and the second electrode E2.

A sixth insulating layer L6 or the insulating pattern may be located on the light emitting element ED. The sixth insulating layer L6 may cover at least a part of the upper surface of the light emitting element ED.

The light emitting element ED may be electrically connected to the first electrode E1 through a first connection electrode CNE1, and the light emitting element ED may be electrically connected to the second electrode E2 through a second connection electrode CNE2.

The second connection electrode CNE2 may be located on the light emitting element ED and the second electrode E2. A seventh insulating layer L7 may be located on the second connection electrode CNE2. The first connection electrode CNE1 may be located on the light emitting element ED and the first electrode E1. Even if the length of the light emitting element ED is about several hundred micrometers or less, the second connection electrode CNE2 and the first connection electrode CNE1 may not be in direct contact with each other due to the seventh insulating layer L7. However, this is only one embodiment of the present disclosure, and in another embodiment of the present disclosure, the first connection electrode CNE1 and the second connection electrode CNE2 may be simultaneously formed through the same process. In this embodiment, the seventh insulating layer L7 may be omitted.

The first connection electrode CNE1 and the second connection electrode CNE2 may include a conductive material. For example, the conductive material may include at least one among indium zinc oxide (IZO), indium tin oxide (ITO), indium gallium oxide (IGO), indium gallium zinc oxide (IGZO), and/or a mixture/compound thereof. However, the present disclosure is not limited thereto. For example, the conductive material may be a metal material, and the metal material may include, for example, molybdenum (Mo), silver (Ag), titanium (Ti), copper (Cu), aluminum (Al), and/or an alloy thereof.

An eighth insulating layer L8 may be located on the first connection electrode CNE1 and the seventh insulating layer L7. The eighth insulating layer L8 may be an encapsulation layer.

A light blocking layer BM may be located on one surface of the second base layer BL2 facing the first base layer BL1. An opening may be provided in the light blocking layer BM, and a wavelength converter CL may cover the opening. The area exposed by the opening may correspond to a pixel emission area PXA.

The wavelength converter CL may include a resin BR and a light emitter QD. The resin BR is a medium in which the light emitter QD is dispersed, and may be formed of various resin compositions, which may be generally referred to as a binder. However, the present disclosure is not limited thereto, and the resins BR may be referred to as a base resin regardless of its name, additional functions, materials, and the like, as long as it is a medium capable of dispersing the light emitter QD. The base resin may be a polymer resin. For example, the base resin may be an acrylic resin, a urethane resin, a silicone resin, an epoxy resin, or the like. The base resin may be a transparent resin.

The light emitter QD may absorb a first light provided from the light emitting element ED, and may convert the wavelength of the first light to emit a second color light that is different color from the first light. The light emitter QD may be, for example, a quantum dot. The first light may be blue light, and the second color light may be green light or red light.

The quantum dot has a crystalline structure of a few nanometers in size, containing hundreds to thousands of atoms, and exhibits a quantum confinement effect in which an energy band gap is increased due to its small size. When a wavelength of light incident on the quantum dot has an energy that is higher than the band gap, the quantum dot is excited by absorbing the light, and falls to a ground state while emitting light of a given wavelength. The emitted light of the specific wavelength has a value corresponding to the band gap. When the quantum dot is adjusted in size and composition, the luminescence characteristics from the quantum confinement effect can be controlled.

The quantum dot may have a core-shell structure including a core, and a shell surrounding the core. Also, the quantum dot may have a core-shell structure in which one quantum dot surrounds another quantum dot. The interface between the core and the shell may have a concentration gradient where the concentration of an element in the shell decreases closer to the center.

The quantum dot may be a particle having a size on the nanometer scale. The quantum dot may have a full width of half maximum (FWHM) of a light emission wavelength spectrum of about 45 nm or less, of about 40 nm or less, or of about 30 nm or less, and color purity or color reproducibility may be improved in the above range. Also, light emitted through such quantum dot is emitted in all directions, so that a wide viewing angle may be improved.

In addition, although the form of the quantum dot is not particularly limited, a quantum dot in the form of spherical, pyramidal, multi-arm, or cubic nanoparticles, nanotubes, nanowires, nanofibers, nano-plate particles, and the like may be used.

In another embodiment of the present disclosure, the wavelength converter CL may be replaced with a color filter. The color filter may implement color by absorbing light of a specific wavelength. In another embodiment of the present disclosure, the wavelength converter CL may be omitted. In this case, the light emitting element ED may emit blue light, green light, or red light. Also, in another embodiment of the present disclosure, the display device DD may further include a color filter layer located between the wavelength converter CL and the second base layer BL2.

A ninth insulating layer L9 may be located between the wavelength converter CL and the eighth insulating layer L8. For example, the first base layer BL1 on which the pixel circuit and the light emitting element ED are located, and the second base layer BL2 on which the wavelength converter CL and the light blocking layer BM are located, may be bonded by the ninth insulating layer L9. For example, the ninth insulating layer L9 may be a filler, an optically clear adhesive film, an optically clear resin, or a pressure sensitive adhesive film. However, this is only one example, and in another embodiment of the present disclosure, the ninth insulating layer L9 may be omitted. In this case, a cell gap may be provided between the wavelength converter CL and the eighth insulating layer L8.

Figure 7:
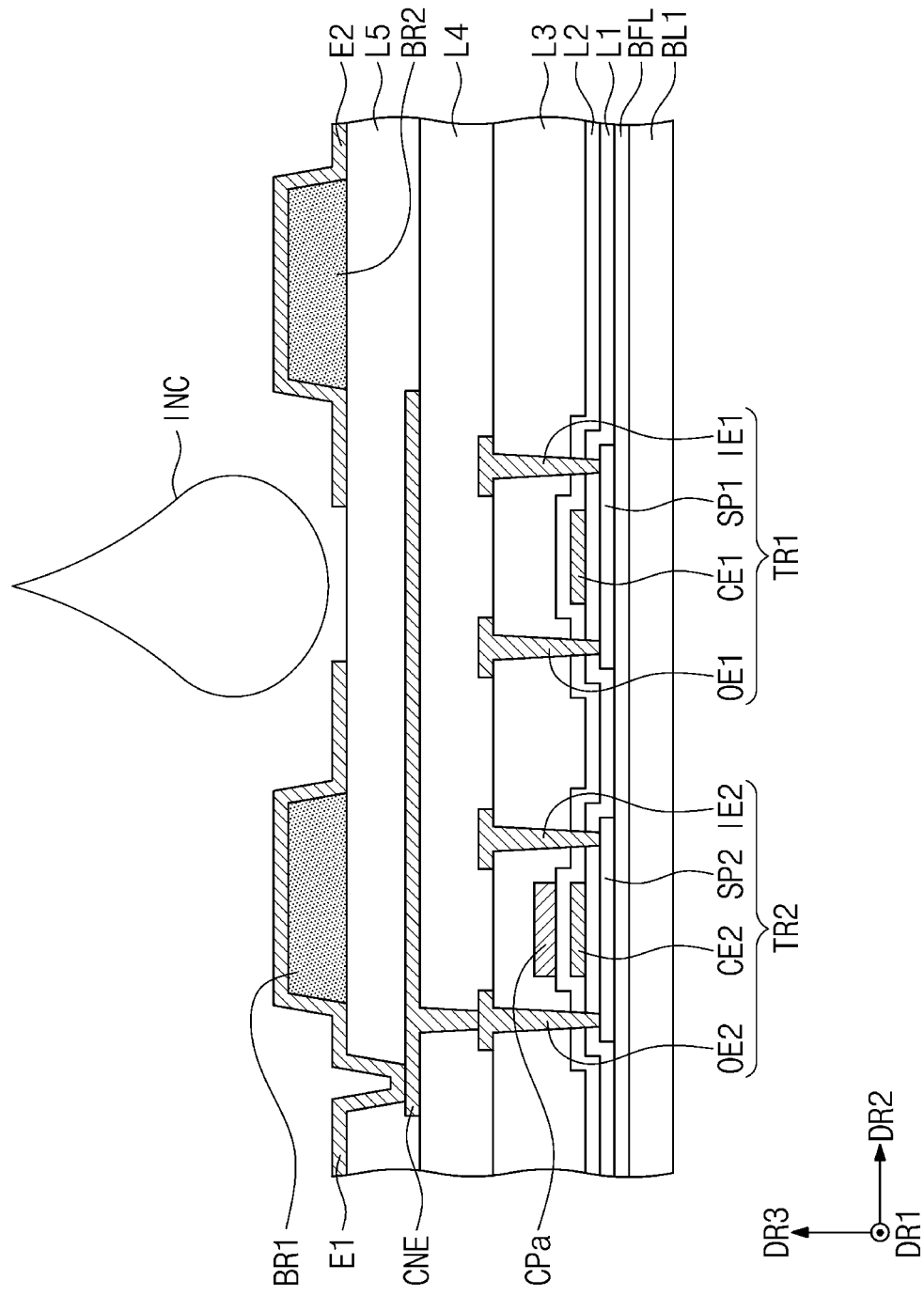
FIG. 7 is a cross-sectional view illustrating part of a method for manufacturing a display device according to an embodiment of the present disclosure.
Figure 8A:
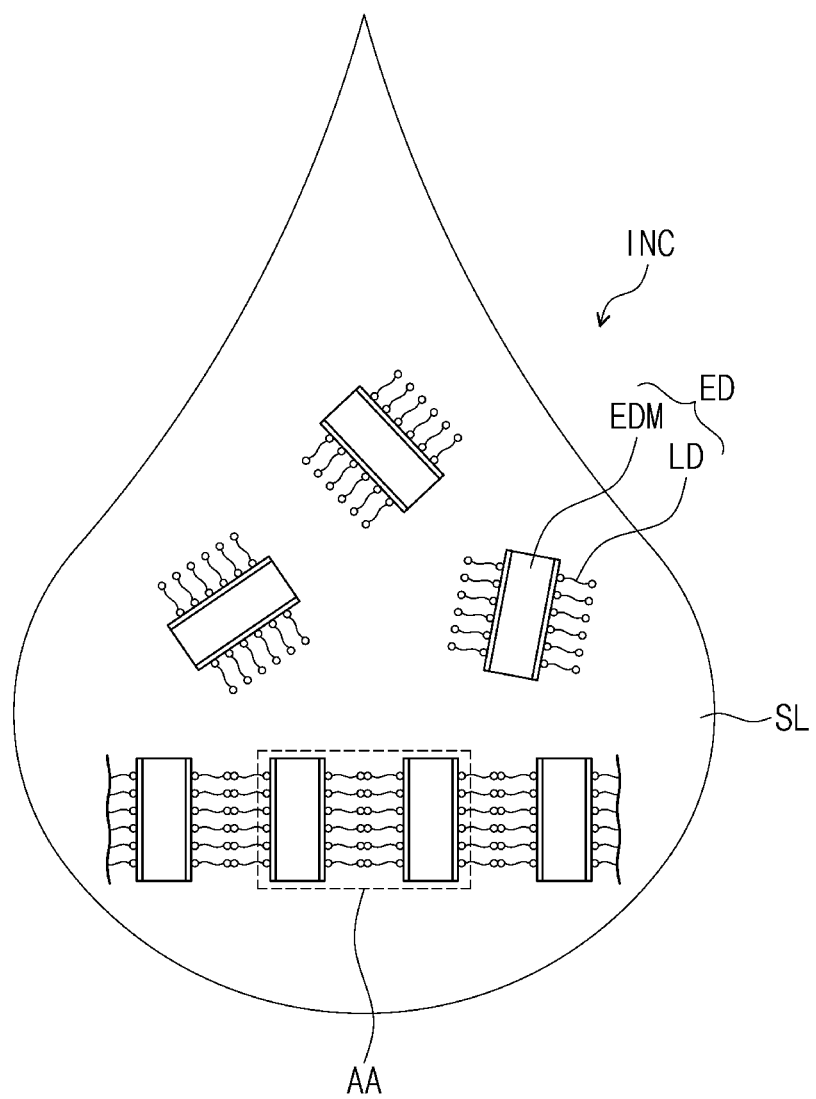
FIG. 8A is a schematic view illustrating some enlarged part of configuration in FIG. 7.
Figure 8B:
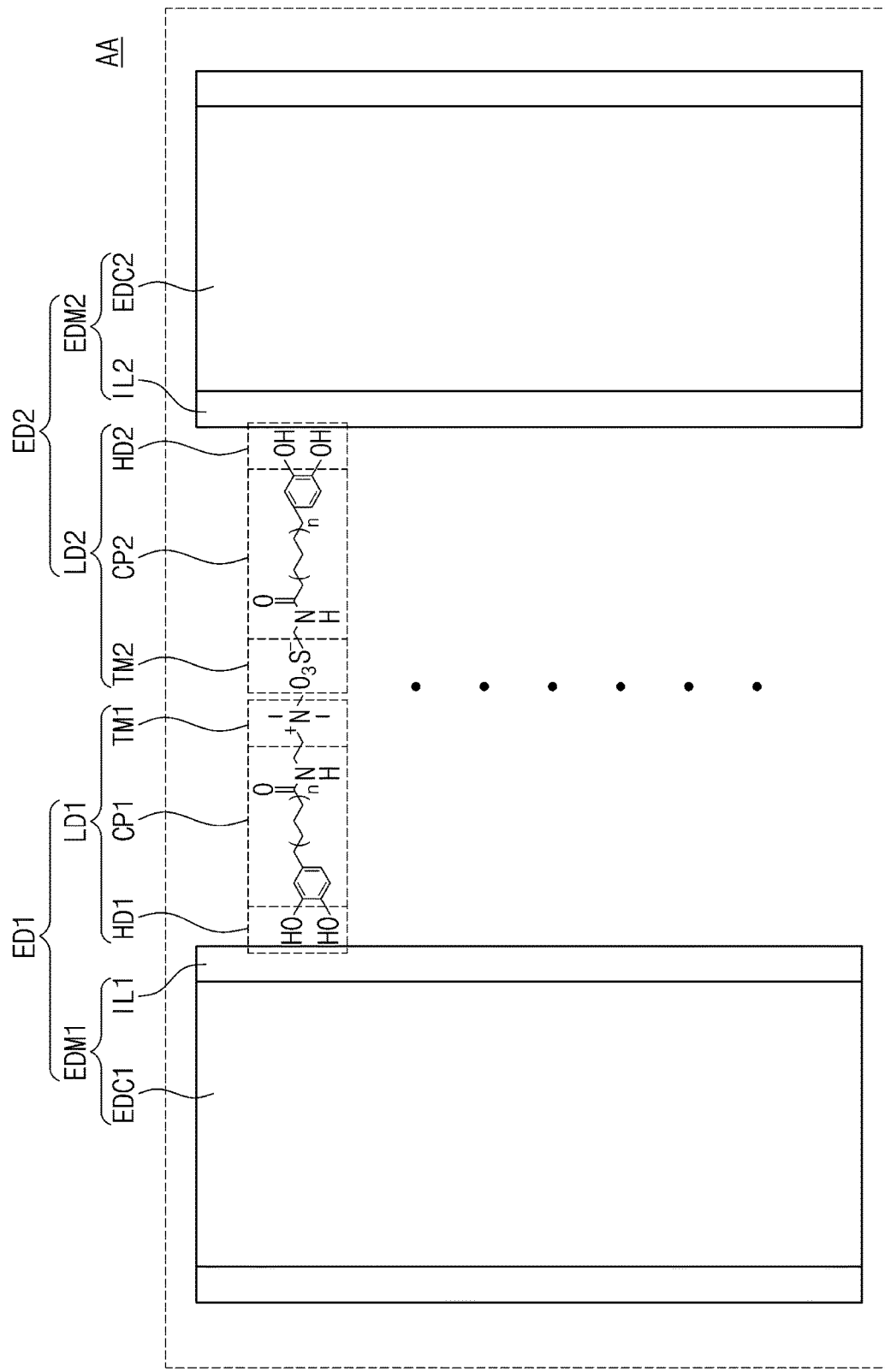
FIG. 8B is a schematic view illustrating part of FIG. 8A in more detail.

FIG. 7 is a cross-sectional view illustrating some steps of a method for manufacturing a display device according to an embodiment of the present disclosure. FIG. 8A is a schematic view showing some enlarged part of configuration illustrated in FIG. 7. FIG. 8B is a schematic view illustrating part of FIG. 8A in more detail. FIG. 8B illustrates area AA of FIG. 8A. Hereinafter, a method for manufacturing a display device according to an embodiment of the present disclosure will be described with reference to FIGS. 7, 8A, and 8B. On the other hand, the components same as those illustrated above in FIGS. 1 to 6 are given the same reference numerals, and repeated description thereof will be omitted.

A method for manufacturing a display device according to an embodiment includes locating a circuit layer CCL (see FIG. 6) on the first base layer BL1, and forming the first electrode E1 and the second electrode E2 on the circuit layer CCL. According to an embodiment, the method includes providing a solution INC including a plurality of light emitting elements ED and a solvent SL on the formed first electrode E1 and second electrode E2. The plurality of light emitting elements ED are included in the solution INC and provided on the first electrode E1 and the second electrode E2, and are then aligned to be connected to the first electrode E1 and the second electrode E2 after the solvent SL is vaporized. The method according to an embodiment may further include aligning the light emitting elements ED by applying power to the first electrode E1 and the second electrode E2 before the solvent SL is vaporized. In the process of alignment, an electric field is formed between the first electrode E1 and the second electrode E2, and bipolar polarity is induced in the light emitting element ED by the formed electric field so that the light emitting element ED may be aligned between the first electrode E1 and the second electrode E2 by the dielectrophoretic force.

Each of the plurality of light emitting elements ED according to an embodiment includes a body EDM and a ligand LD. Hereinafter, the description of the light emitting element ED may be the same as the descriptions of the light emitting elements ED and ED' of the embodiment described above in FIGS. 5A and 5B.

The plurality of light emitting elements ED included in the solution INC may include a first light emitting element ED1 and a second light emitting element ED2. The first light emitting element ED1 may include a first body EDM1 and a first ligand LD1 connected to the first body EDM1. The second light emitting element ED2 may include a second body EDM2 and a second ligand LD2 connected to the second body EDM2. The first body EDM1 includes the first core portion EDC1, and the second body EDM2 includes the second core portion EDC2.

The first ligand LD1 included in the first light emitting element ED1 may include a first end portion TM1 having a positive charge. The second ligand LD2 included in the second light emitting element ED2 may include a second end portion TM2 having a negative charge. In an embodiment, the first end portion TM1 may include an ammonium cation, and the second end portion TM2 may include a sulfonate anion. However, the present disclosure is not limited thereto. As the first end portion TM1 having a positive charge and the second end portion TM2 having a negative charge are bonded to each other by electrostatic attraction, the plurality of light emitting elements ED may be aligned in the solution INC as shown in FIG. 8A.

FIG. 8B shows that the first head portion HD1 and the second head portion HD2 include a catechol group, and the first chain portion CP1 and the second chain portion CP2 include an amide group, but the present disclosure is not limited thereto, and the first head portion HD1 and the second head portion HD2 may include a functional group for bonding to the insulating films IL1 and IL2 of the bodies EDM1 and EDM2, and the first chain portion CP1 and the second chain portion CP2 may include a functional group to be dispersed in a water-soluble solvent SL of the solution INC. The first chain portion CP1 and the second chain portion CP2 may be formed to have a length selected so that the first light emitting element ED1 and the second light emitting element ED2 maintain suitable spacing.

The light emitting element according to an embodiment of the present disclosure includes a body and a ligand bonded to the body, and the ligand includes an end portion having a positive charge or a negative charge at the end. When the light emitting element according to an embodiment of the present disclosure is dissolved in a water-soluble solvent and provided on the electrode of the display device in a solution state, the light emitting element of the embodiment is evenly dispersed in the solution as the dispersibility in the water soluble solvent increases by the end portion of the ligand having an electric charge.

In addition, the plurality of light emitting elements may include a ligand having an end portion with a positive charge and a ligand having an end portion with a negative charge, such that the plurality of light emitting elements may be aligned (e.g., at predetermined intervals) in the solution by electrostatic bonding between the end portion with a positive charge and the end portion with a negative charge. Accordingly, the light emitting elements aligned in the solution may be evenly aligned in the electrode after the solution including the plurality of light emitting elements is provided on the electrode of the display device, thereby improving manufacturing yield and reliability of the display device.

Figure 9A:
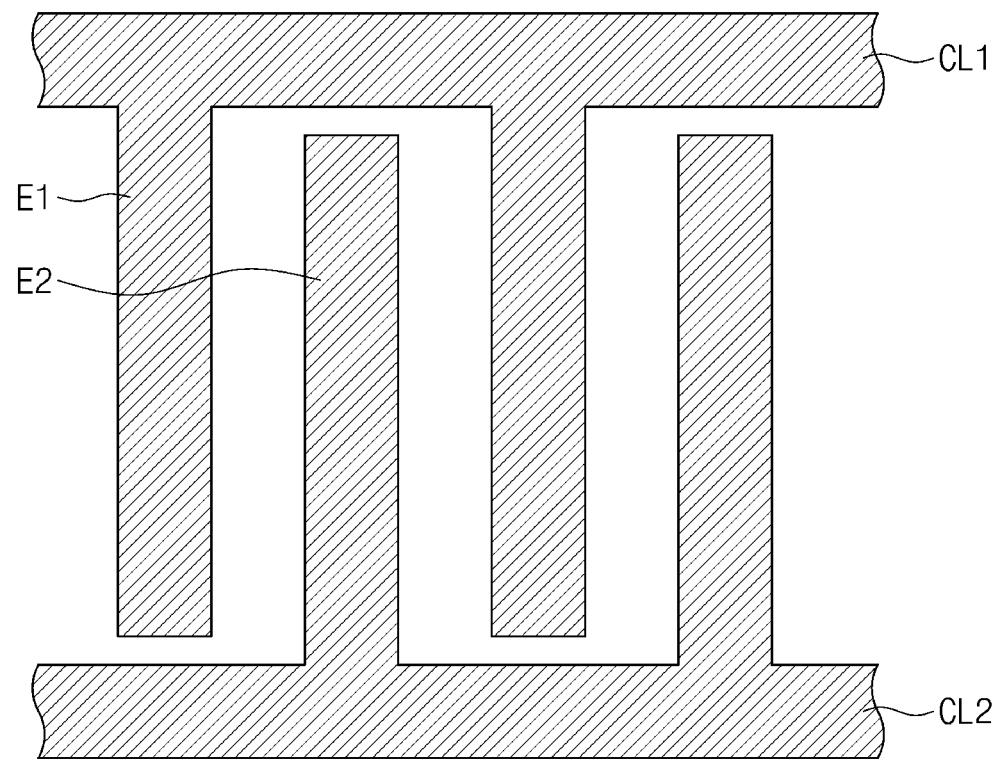
FIGS. 9A and 9B are a plan view illustrating part of a display panel according to an embodiment of the present disclosure.
Figure 9A:
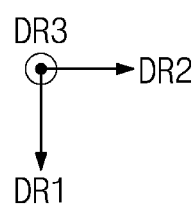
Figure 9B:
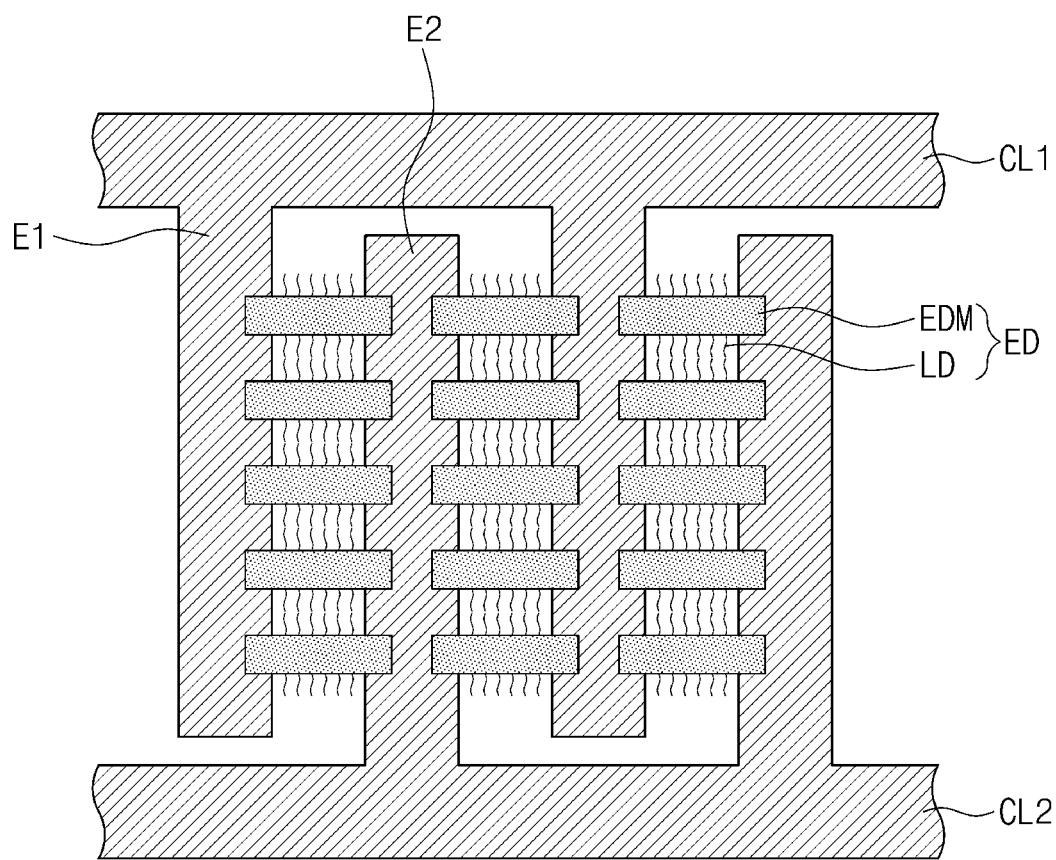
Figure 9B:
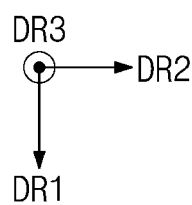

FIGS. 9A and 9B are a plan view illustrating some components of a display panel according to an embodiment of the present disclosure. For the description of FIGS. 9A and 9B, the components same as those described in FIGS. 1 to 5 are given the same reference numerals, and repeated description thereof will be omitted. FIGS. 9A and 9B illustrate areas corresponding to one pixel, and some components are omitted in description.

Referring to FIGS. 9A and 9B, each of the first electrode E1 and the second electrode E2 may be provided in plurality in one pixel area. FIGS. 9A and 9B illustrate that each of the first electrode E1 and the second electrode E2 are provided in two as an example, but the present disclosure is not limited thereto. For example, only one first electrode E1 and one second electrode E2 may be located in one pixel area, and the number of each of the first electrode E1 and second electrode E2 located in one pixel area may be three or more.

The first electrode E1 may be connected to a first connection line CL1, and the second electrode E2 may be connected to a second connection line CL2. The first connection line CL1 and the first electrode E1 may be formed as a single body, and the second connection line CL2 and the second electrode E2 may be formed as a single body. The first connection line CL1 may electrically connect the first electrode E1 and the connection electrode CNE (see FIG. 6), and the second connection line CL2 may electrically connect the second electrode E2 and the power line. The first electrode E1 and the second electrode E2 may be spaced apart from each other. For example, the first electrode E1 and the second electrode E2 may be alternately arranged in the second direction DR2.

FIG. 9B is a plan view illustrating the first electrode E1 and the second electrode E2, and also illustrating the light emitting element ED electrically connected to the first electrode E1 and the second electrode E2. The light emitting element ED, as described above, may be aligned in the solution by electrostatic bonding between the ligands LD before the solution including a plurality of light emitting elements ED is provided on the first electrode E1 and the second electrode E2, so that the light emitting elements ED may be aligned (e.g., at predetermined intervals) on the first electrode E1 and the second electrode E2, and the arrangement position may be controlled. Accordingly, reliability of the display panel and the display device including the light emitting element ED may be improved.

According to embodiments of the present disclosure, a ligand having a positive or a negative charge at an end portion thereof may be bonded to the surface of a light emitting element, and thus the alignment characteristics of the light emitting elements may be improved when the light emitting elements are applied to a display device, resulting in an improvement in reliability and manufacturing yield of the display device.

Although the present disclosure has been described with reference to a preferred embodiment of the present disclosure, it will be understood by those skilled in the art that various changes in form and details may be made therein without departing from the spirit and scope of the present disclosure.

Accordingly, the technical scope of the present disclosure is not intended to be limited to the contents set forth in the detailed description of the specification, but is intended to be defined by the appended claims, with functional equivalents thereof to be considered as included therein.

What is claimed is:

1. A light emitting element comprising:
   a body comprising:
      a semiconductor layer;
      an active layer; and
      an insulating film covering a side surface of the semiconductor layer and the active layer, and comprising a metal oxide;
   a ligand comprising:
      a head portion bonded to the insulating film at an exterior surface of the body, the head portion being a hydroxyl group, a thiol group, a catechol group, or a carboxyl group, wherein the exterior surface of the body is a surface that defines an outermost surface of the body;
      an end portion spaced apart from the body, and having a positive or a negative charge; and
      a chain portion connecting the head portion and the end portion.

2. The light emitting element of claim 1, wherein the semiconductor layer comprises a first semiconductor layer, and a second semiconductor layer spaced apart from the first semiconductor layer with the active layer therebetween.

3. The light emitting element of claim 2, wherein the body further comprises:
   a first contact electrode adjacent to the first semiconductor layer; and
   a second contact electrode adjacent to the second semiconductor layer.

4. The light emitting element of claim 1, wherein the ligand comprises a first ligand comprising a first end portion having a positive charge, and
   wherein the light emitting element further comprises a second ligand comprising a second end portion having a negative charge.

5. The light emitting element of claim 4, wherein the body comprises:
   a first side surface to which the first ligand is bonded; and
   a second side surface facing the first side surface, and to which the second ligand is bonded.

6. The light emitting element of claim 1, wherein the chain portion comprises a substituted or an unsubstituted alkyl group, a substituted or an unsubstituted amine group, a substituted or an unsubstituted oxy group, a substituted or an unsubstituted thiol group, a substituted or an unsubstituted ester group, or a substituted or an unsubstituted amide group.

7. The light emitting element of claim 1, wherein a length of the body is in a range from about 1 μm to about 100 μm.

8. A display device comprising:
a pixel circuit;
an insulating layer covering the pixel circuit;
a first electrode on the insulating layer, and electrically connected to the pixel circuit;
a second electrode on the insulating layer, and spaced apart from the first electrode; and
a plurality of light emitting elements electrically connected to the first electrode and the second electrode, the plurality of light emitting elements comprising:
a body comprising an insulating film covering a side surface of a semiconductor layer and an active layer, and comprising a metal oxide; and
a ligand comprising:
a head portion bonded to the insulating film at an exterior surface of the body, the head portion being a hydroxyl group, a thiol group, a catechol group, or a carboxyl group, wherein the exterior surface of the body is a surface that defines an outermost surface of the body;
an end portion spaced apart from the body, and having a positive or a negative charge; and
a chain portion connecting the head portion and the end portion.

9. The display device of claim 8, wherein the body comprises:
a first contact electrode electrically connected to the first electrode;
a first semiconductor layer on the first contact electrode;
an active layer on the first semiconductor layer;
a second semiconductor layer spaced apart from the first semiconductor layer with the active layer therebetween; and
a second contact electrode on the second semiconductor layer, and electrically connected to the second electrode.

10. The display device of claim 9, wherein the light emitting elements comprise a first light emitting element comprising a first ligand having a positive charge, and a second light emitting element adjacent to the first light emitting element and comprising a second ligand having a negative charge.

11. The display device of claim 10, wherein:
the first ligand comprises a first end portion having a positive charge;
the second ligand comprises a second end portion having a negative charge; and
the first end portion and the second end portion are electrostatically bonded to each other.

* * * * *

UNITED STATES PATENT AND TRADEMARK OFFICE
CERTIFICATE OF CORRECTION

| | | |
|---|---|---|
| PATENT NO. | : 11,955,468 B2 | Page 1 of 1 |
| APPLICATION NO. | : 16/932591 | |
| DATED | : April 9, 2024 | |
| INVENTOR(S) | : Yunku Jung et al. | |

It is certified that error appears in the above-identified patent and that said Letters Patent is hereby corrected as shown below:

On the Title Page

In item (72), in Column 1, under "inventors", Line 5, delete "Anyang-si" and insert -- Asan-si --.

In item (72), in Column 1, under "inventors", Line 8, delete "Seoul" and insert -- Hwaseong-si --.

Signed and Sealed this
Twenty-fourth Day of September, 2024

Katherine Kelly Vidal
*Director of the United States Patent and Trademark Office*